(12) United States Patent
Tan et al.

(10) Patent No.: US 11,039,531 B1
(45) Date of Patent: Jun. 15, 2021

(54) SYSTEM AND METHOD FOR IN-MOLDED ELECTRONIC UNIT USING STRETCHABLE SUBSTRATES TO CREATE DEEP DRAWN CAVITIES AND FEATURES

(71) Applicant: Flex Ltd., Singapore (SG)

(72) Inventors: Jesus Tan, San Jose, CA (US); Anwar Mohammed, San Jose, CA (US); David Geiger, Dublin, CA (US); Weifeng Liu, Dublin, CA (US)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 15/980,096

(22) Filed: May 15, 2018

Related U.S. Application Data

(60) Provisional application No. 62/626,409, filed on Feb. 5, 2018.

(51) Int. Cl.
| | |
|---|---|
| H05K 1/03 | (2006.01) |
| H05K 1/02 | (2006.01) |
| H05K 1/09 | (2006.01) |
| H05K 1/18 | (2006.01) |
| H05K 5/06 | (2006.01) |
| H05K 3/12 | (2006.01) |
| H05K 3/30 | (2006.01) |
| H05K 3/28 | (2006.01) |

(52) U.S. Cl.
CPC ......... *H05K 1/0283* (2013.01); *H05K 1/0266* (2013.01); *H05K 1/092* (2013.01); *H05K 1/181* (2013.01); *H05K 3/1216* (2013.01); *H05K 3/284* (2013.01); *H05K 3/303* (2013.01); *H05K 5/065* (2013.01); *H05K 2201/0129* (2013.01); *H05K 2201/0145* (2013.01); *H05K 2201/09936* (2013.01); *H05K 2203/1316* (2013.01); *H05K 2203/1327* (2013.01)

(58) Field of Classification Search
CPC .... H05K 1/0283; H05K 1/0266; H05K 1/092; H05K 1/181; H05K 3/284; H05K 3/303
USPC ........................................................ 361/750
See application file for complete search history.

(56) References Cited

U.S. PATENT DOCUMENTS

| | | | |
|---|---|---|---|
| 4,630,172 A | | 12/1986 | Stenerson |
| 4,838,892 A | * | 6/1989 | Wyler ...................... C14B 7/04 |
| | | | 8/94.1 R |
| 4,855,537 A | | 8/1989 | Nakai et al. |
| 5,159,750 A | | 11/1992 | Dutta |
| 5,459,639 A | | 10/1995 | Izumi |
| 5,479,138 A | | 12/1995 | Kuroda et al. |
| 5,675,299 A | | 10/1997 | Suski |

(Continued)

OTHER PUBLICATIONS

Non-Final Office Action dated Sep. 4, 2018, U.S. Appl. No. 15/064,437, filed Mar. 8, 2016, applicant: JL Zhou, 14 pages.

(Continued)

*Primary Examiner* — Tremesha S Willis
(74) *Attorney, Agent, or Firm* — Haverstock & Owens LLP

(57) ABSTRACT

An In-Mold Electronics (IME) device and method of manufacturing the IME device introduce a stretchable substrate laminated to a thermoplastic layer. The stretchable substrate has a screen printable surface for receiving printed conductive interconnects. This combination enables formation of an IME device with conductive interconnects oriented for hard to reach cavities and areas. The IME device eliminates the need to have additional mold features to enable deeper drawn cavities.

24 Claims, 3 Drawing Sheets

(56) References Cited

U.S. PATENT DOCUMENTS

| | | | |
|---|---|---|---|
| 6,035,524 A | 3/2000 | Suppa | |
| 6,518,677 B1 | 2/2003 | Capote | |
| 6,541,712 B1 | 4/2003 | Gately et al. | |
| 7,281,328 B2 | 10/2007 | Lee | |
| 7,504,904 B1 | 3/2009 | Powers et al. | |
| 8,034,447 B2 | 10/2011 | Sakai | |
| 8,222,537 B2 | 7/2012 | Dudnikov, Jr. | |
| 8,302,301 B2 | 11/2012 | Lau | |
| 8,450,848 B2 | 5/2013 | Sakurai | |
| 8,497,579 B1 | 7/2013 | Shih | |
| 8,519,270 B2 | 8/2013 | Chang | |
| 8,587,385 B2 | 11/2013 | Umeda | |
| 8,728,865 B2 | 3/2014 | Haba | |
| 8,928,865 B2 | 1/2015 | Rakuljic | |
| 8,970,051 B2 | 3/2015 | Shi | |
| 9,554,465 B1* | 1/2017 | Liu | H05K 1/092 |
| 2001/0010303 A1 | 8/2001 | Caron | |
| 2002/0056906 A1 | 5/2002 | Kajiwara | |
| 2003/0170553 A1 | 9/2003 | Eberlein | |
| 2004/0224441 A1 | 11/2004 | Saito | |
| 2005/0039945 A1 | 2/2005 | Matsuda | |
| 2006/0132427 A1 | 6/2006 | Weisberg | |
| 2006/0254811 A1 | 11/2006 | Kirstein | |
| 2008/0217708 A1 | 9/2008 | Resiner | |
| 2008/0282540 A1 | 11/2008 | Singleton | |
| 2009/0029504 A1 | 1/2009 | Paik | |
| 2009/0166835 A1 | 7/2009 | Yang | |
| 2011/0135248 A1 | 6/2011 | Langer | |
| 2012/0024575 A1 | 2/2012 | Zhang | |
| 2012/0119404 A1* | 5/2012 | Wallace | B32B 38/12 264/101 |
| 2012/0234587 A1 | 9/2012 | Nakamura | |
| 2013/0069239 A1 | 3/2013 | Kim | |
| 2013/0214396 A1 | 8/2013 | Kim | |
| 2015/0001731 A1 | 1/2015 | Shuto | |
| 2015/0257278 A1 | 9/2015 | Niskala | |
| 2015/0287672 A1 | 10/2015 | Yazdani | |
| 2016/0021762 A1 | 1/2016 | Kallman | |
| 2016/0043047 A1 | 2/2016 | Shim | |
| 2016/0329272 A1 | 11/2016 | Geissler | |
| 2017/0047308 A1 | 2/2017 | Ho | |
| 2017/0099729 A1 | 4/2017 | Kim et al. | |
| 2017/0141080 A1 | 5/2017 | Chen | |
| 2017/0170799 A1 | 6/2017 | Kong et al. | |
| 2017/0250170 A1 | 8/2017 | Yu | |
| 2018/0090471 A1 | 3/2018 | Chiu | |
| 2018/0164921 A1* | 6/2018 | Leigh | G06F 3/04883 |
| 2018/0269181 A1 | 9/2018 | Yang | |
| 2018/0277485 A1 | 9/2018 | Han | |
| 2018/0366412 A1 | 12/2018 | Hsieh | |
| 2019/0019758 A1 | 1/2019 | Kim | |
| 2019/0029136 A1* | 1/2019 | Bharadwaj | H05K 5/0247 |
| 2019/0051615 A1 | 2/2019 | Nair | |
| 2019/0074267 A1 | 3/2019 | Yang | |
| 2019/0181097 A1 | 6/2019 | Cheah | |
| 2019/0295937 A1 | 9/2019 | Zhang | |
| 2019/0385977 A1 | 12/2019 | Elsherbini | |
| 2020/0043299 A1* | 2/2020 | Mabille | G06Q 20/20 |
| 2020/0108768 A1* | 4/2020 | Ali | B60K 35/00 |
| 2020/0194330 A1 | 6/2020 | Ramanathan | |
| 2020/0029492 A1 | 9/2020 | Bhagavat | |

OTHER PUBLICATIONS

Non-Final Office Action dated Feb. 4, 2020, U.S. Appl. No. 16/221,256, filed Dec. 14, 2018, Applicant: Cheng Yang, 18 pages.

Non-Final Office Action, U.S. Appl. No. 16/196,395, filed Nov. 20, 2018, applicant: Yoav Alfandri, dated Oct. 4, 2019, 13 pages.

* cited by examiner

SYSTEM AND METHOD FOR IN-MOLDED ELECTRONIC UNIT USING STRETCHABLE SUBSTRATES TO CREATE DEEP DRAWN CAVITIES AND FEATURES

RELATED APPLICATIONS

This Patent Application claims priority under 35 U.S.C. 119(e) of the U.S. provisional patent applications, Application Ser. No. 62/626,409, filed on Feb. 5, 2018, and entitled "System And Method For In-Molded Electronic Unit Using Stretchable Substrates To Create Deep Drawn Cavities And Features", which is hereby incorporated in its entirety by reference.

FIELD OF THE INVENTION

The present invention is generally directed to the field of In-Mold Electronics (IME), or structural electronics. More specifically, the present invention is directed to systems and methods for an IME unit that includes stretchable substrates to form deep drawn cavities and features.

BACKGROUND OF THE INVENTION

In-Mold Electronics (IME), or structural electronics, utilize the capabilities of flexible and printed electronics, thermoforming and injection molding. Thermoforming is a manufacturing process where a plastic sheet is heated to a sufficient temperature that permits the heated sheet to be stretched into or onto a mold and cooled to a finished shape. Stretchable conductive ink is screen printed onto a thermoformable plastic sheet to form conductive traces, or interconnects, prior to the thermoforming process. The circuit remains functional as the conductive interconnects contour a desired 3D shape formed during the thermoforming process. Applications range from automotive, home appliances and automation, wearables, consumer goods, and healthcare.

FIG. 1A illustrates a conventional in-mold electronics (IME) process flow and FIG. 1B illustrates a conventional IME stack-up made using the conventional IME process of FIG. 1A. The IME stack-up 2 is shown in FIG. 1B in a non-molded shape to better illustrate the various layers. At the step 14, a film screen printing step is performed. In particular, at the step 14A, a decorative layer 6 or 7 is applied onto a first (top side) surface or a second (bottom side) surface of a film 4, such as by screen printing or an IMD (In-Mold Decorating) process. The film 4 is a non-stretchable thermoformable plastic sheet, such as a polycarbonate (PC) or formable PET (polyethylene terephthalate). In general, such conventional films are non-stretchable and substantially rigid, although at thin enough thicknesses some films have a degree of flexibility. At the step 14B, a functional layer 8 is screen printed onto the second (bottom side) surface of the film 4. The functional layer 8 is made of stretchable conductive ink, such as silver ink. The stretchable conductive ink forms conductive interconnects, and the term "functional" refers to electrical functionality. At the optional step 14C, a protective layer 9 is screen printed over the conductive interconnects. The protective layer 9 is made of an insulating material. During each of the screen printing steps 14A, 14B, 14C, the film 4 is a planar sheet. At a step 15, the screen printed layers are then cured.

At the step 16, electrical components 10 are placed on the functional layer 8 such that electrical contacts on each electrical component 10 are in electrical contact with the functional layer 8. At the step 18, the electrical components 10 are attached to the functional layer 8, such as using electrically conductive adhesive (ECA) or solder. At the step 20, a thermoforming step is performed where the film 4 with printed layers 6, 8 and electrical components 10 is formed into a desired shape (not shown in FIG. 1B). At the step 22, a trimming process is performed to remove excess material from the thermoformed shape. At the step 24, an injection molding process is performed where a molding layer 12 is formed over the second (bottom side) surface to encapsulate the components 10 and the functional layer 8.

Screen printing conductive interconnects to a thermoformable plastic sheet necessitates the sheet to have a screen printable surface. In some cases, a specific type of material is used to which ink will adhere. In other cases, the surface to be printed on is mechanically or chemically roughened so that ink will adhere. Further, in order to achieve deeper drawn cavities, additional mold features are required, such as plug assists.

SUMMARY OF THE INVENTION

Embodiments of an IME device and method of manufacturing the IME device introduce a stretchable substrate laminated to a thermoplastic layer. The stretchable substrate has a screen printable surface for receiving printed conductive interconnects. This combination enables formation of an IME device with conductive interconnects oriented for hard to reach cavities and areas. The IME device of the instant disclosure eliminates the need to have additional mold features to enable deeper drawn cavities.

In an aspect, a device is disclosed. The device includes a thermoplastic layer, a stretchable substrate laminated to the thermoplastic layer, and an electrically stretchable conductor ink pattern on a surface of the stretchable substrate to form a conductive interconnect. The thermoplastic layer, the stretchable substrate, and the conductive interconnect are thermoformed to a molded shape. In some embodiments, the molded shape is a three-dimensional shape. In some embodiments, the thermoplastic layer is made of a non-stretchable material. In some embodiments, the thermoplastic layer is made of a material consisting of polycarbonate or formable polyethylene terephthalate. In some embodiments, the stretchable substrate is made of a material consisting of thermoplastic polyurethane or thermoplastic elastomer. In some embodiments, the electrically stretchable conductor ink is made of a material consisting of silver ink, copper ink, nickel ink, or a conductive ink embedded with polymer. In some embodiments, the electrically stretchable conductor ink is further patterned to form an electrical component connected to the conductive interconnect. In some embodiments, the device further comprises a discrete electrical component coupled to the conductive interconnect. In some embodiments, the device further comprises an overmold formed over the thermoformed molded shape, wherein the overmold encapsulates the conductive interconnect and the discrete electrical component. In some embodiments, the patterned electrically stretchable conductor ink forms at least two conductive interconnects, and the discrete electrical component is coupled to each of the at least two conductive interconnects. In some embodiments, the device further comprises a graphics layer printed onto a surface of the thermoplastic layer. In some embodiments, the device further comprises a first graphics layer printed onto a first surface of the thermoplastic layer and a second graphics layer printed onto a second surface of the thermoplastic layer.

In another aspect, a method of making an in-mold electronic device is disclosed. The method includes providing a stretchable substrate, printing electrically stretchable conductor ink onto a surface of the stretchable substrate to form a conductive interconnect, stacking the stretchable substrate onto a thermoplastic layer to form a stack-up, thermoforming the stack-up to form a molded subassembly, and trimming the molded subassembly to form a molded shape. In some embodiments, the electrically stretchable conductor ink is further printed to form an electrical component connected to the conductive interconnect. In some embodiments, the method further comprises attaching a discrete electrical component onto the conductive interconnect prior to thermoforming the stack-up. In some embodiments, the method further comprises molding an overmold over the thermoformed molded shape, wherein the overmold encapsulates the conductive interconnect and the discrete electrical component. In some embodiments, the method further comprises attaching a discrete electrical component onto the conductive interconnect after thermoforming the stack-up. In some embodiments, the method further comprises molding an overmold over the thermoformed molded shape, wherein the overmold encapsulates the conductive interconnect and the discrete electrical component. In some embodiments, the method further comprises curing the printed electrically stretchable conductor ink prior to forming the stack-up. In some embodiments, stacking the stacking the stretchable substrate onto a thermoplastic layer comprises first applying an adhesive between the stretchable substrate and the thermoplastic layer, wherein the adhesive maintains proper alignment of the stretchable substrate to the thermoplastic layer prior to thermoforming the stack-up. In some embodiments, the molded shape is a three-dimensional shape. In some embodiments, the thermoplastic layer is made of a non-stretchable material. In some embodiments, the method further comprises printing a graphics layer onto a first surface of the thermoplastic layer prior to forming the stack-up. In some embodiments, the method further comprises printing a first graphics layer onto a first surface of the thermoplastic layer prior to forming the stack-up and printing a second graphics layer onto a second surface of the thermoplastic layer prior to forming the stack-up.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to an IME device and method of manufacturing the IME device. Those of ordinary skill in the art will realize that the following detailed description of the IME device and method of manufacturing the WE device is illustrative only and is not intended to be in any way limiting. Other embodiments of the IME device and method of manufacturing the IME device will readily suggest themselves to such skilled persons having the benefit of this disclosure.

Reference will now be made in detail to implementations of the IME device and method of manufacturing the IME device as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1A:
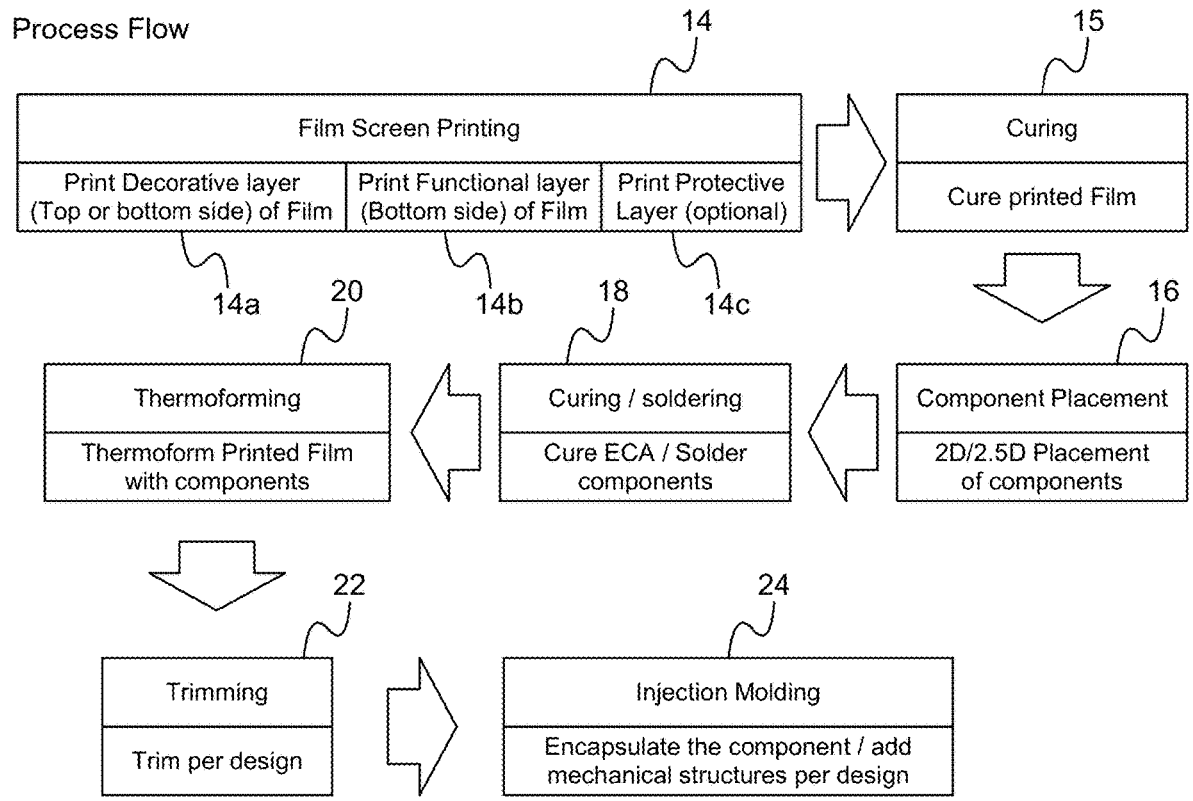
FIG. 1A illustrates a conventional in-mold electronics (IME) process flow.
Figure 1B:
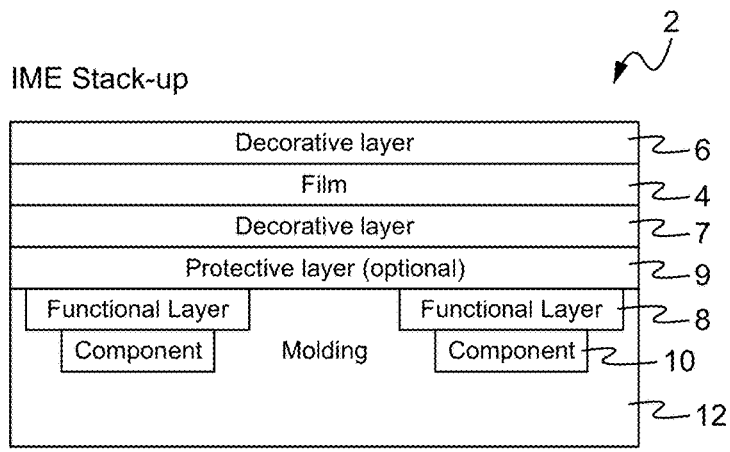
FIG. 1B illustrates a conventional IME product made using the conventional IME process of FIG. 1A.
Figure 2:
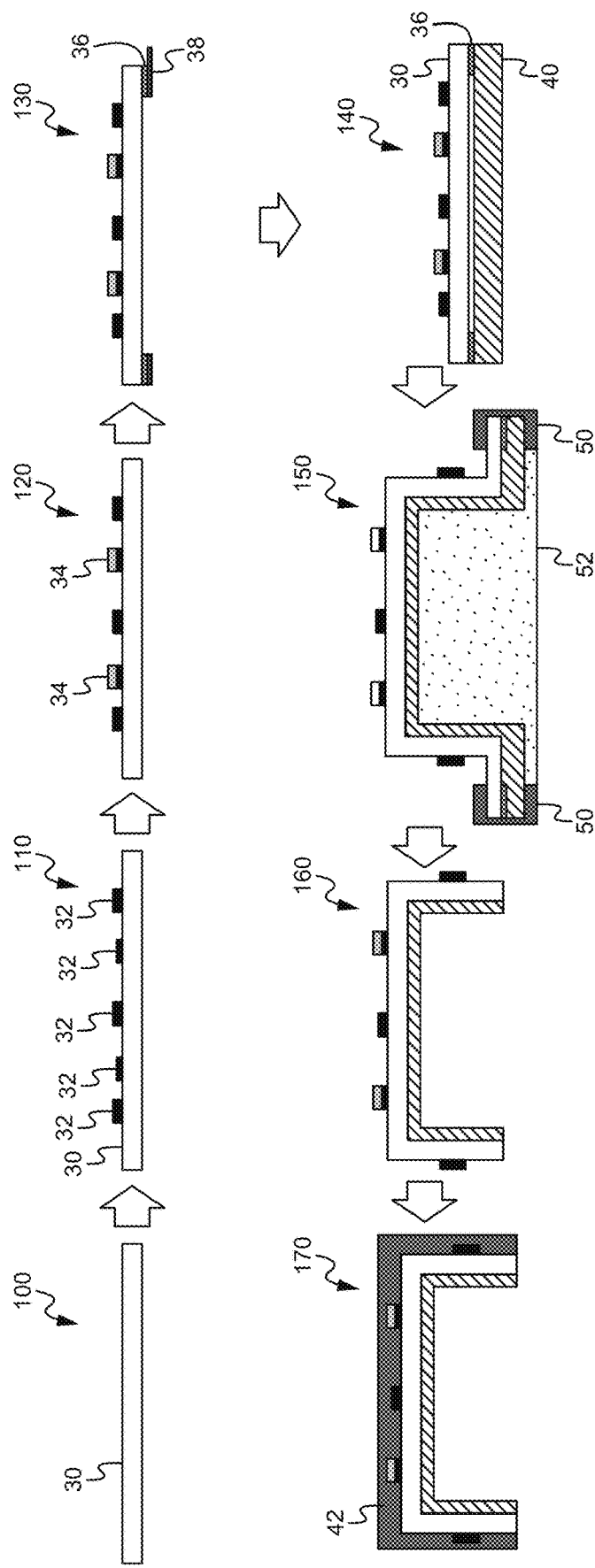
FIG. 2 illustrates an exemplary flow process of a method of manufacturing an IME device according to some embodiments.

FIG. 2 illustrates an exemplary flow process of a method of manufacturing an IME device according to some embodiments. At the step 100, a stretchable substrate 30 is provided. The stretchable substrate is a flexible, stretchable material having a printable surface. Example materials of such a stretchable substrate include, but are not limited to, thermoplastic polyurethane (TPU) and thermoplastic elastomer (TPE). At the step 110, printing and curing are performed. Ink that is both electrically conductive and stretchable is printed on a first (top side) surface of the stretchable substrate 30 to form electrically conductive interconnects 32. It is understood that the conductive interconnects can include conductive traces and component contact pads. Other electrically functional elements, such as electrical components, can be printed using the stretchable conductor ink. Examples of such electrical components include, but are not limited to, stretchable resistors, capacitors, and switches. In some embodiments, the stretchable conductor ink is screen printed onto the surface of the stretchable substrate 30. It is understood that other conventional printing methods can be used that are capable of applying stretchable conductor ink onto a printable surface according to a desired pattern. Exemplary types of stretchable conductor ink include, but are not limited to, silver ink, copper ink, nickel ink, or any conductive ink embedded with polymer. A curing step is then performed to cure the printed stretchable conductor ink. As an optional step, a protective insulating layer is screen printed over the conductive interconnects.

At the step 120, electrical components 34 are positioned on select portions of the printed conductive interconnects 32 to establish an electrical and mechanical connection between the component 34 and the corresponding conductive interconnects 32. Each electrical component 34 is a discrete electrical component, such as a resistor, a capacitor, an inductor, a semiconductor chip or package, or the like. In some embodiments, a pick and place process is used. Each electrical component 34 can be attached using a low temperature electrically conductive adhesive or solder. It is understood that alternative conventional attachment means can be used to mechanically and electrically connect each electrical component 34 to corresponding conductive interconnects 32. Although illustrated and described as being carried out directly following the print and cure steps (step 110), placement and attachment of the electrical components can be completed at any point of the disclosed method following the print and cure steps (step 110) and prior to formation of an encapsulating mold layer (step 170). The attached electrical components may have a lower stretchability tolerance than the stretchable conductor ink previously printed on the stretchable substrate, and therefore be better suited for attachment after the thermoforming step (step 150).

At the step 130, an adhesive 36 is attached to a second (backside) surface of the stretchable substrate 30 to prepare for the following stack-up step. The adhesive can be heat activated and can include a liner 38. The liner 38 provides a temporary cover to the non-adhered side of the adhesive 36. In some embodiments, the adhesive 36 is applied to the stretchable substrate 30 by lamination. Use of the adhesive is optional.

At the step 140, a thermoplastic layer 40 is stacked with the stretchable substrate 30. The thermoplastic layer 40 can be held in aligned position relative to the stretchable substrate 30 by the adhesive 36. In the case where a liner 38 is included, the liner 38 is first removed before the thermoplastic layer 40 is attached to the adhesive 36. The thermoplastic layer 40 is a thermoformable plastic sheet. The thermoformable plastic sheet can be a relatively rigid, non-stretchable structure. Example materials of such a thermoplastic layer include, but are not limited to, polycarbonate (PC), formable PET (polyethylene terephthalate), and similar thermoformable materials. In some embodiments, a graphics layer is printed onto a surface of the thermoplastic layer 40 prior to stacking the thermoplastic layer 40 with the stretchable substrate 30. The graphics layer can be printed on the surface of the thermoplastic layer facing the stretchable substrate 30, the graphics layer can be printed on the surface of the thermoplastic layer facing away from the stretchable substrate 30, or a first graphics layer can be printed on the surface of the thermoplastic layer facing the stretchable substrate 30 and a second graphics layer can be printed on the surface of the thermoplastic layer facing away from the stretchable substrate 30.

At the step 150, a thermoforming step is performed. In some embodiments, the stretchable substrate 30 is laminated to the thermoplastic layer 40 over a shaped mold 52. Although not shown in FIG. 2, an overmold can also be applied on the opposite side (top side) of the stretchable substrate 30. The stacked stretchable substrate 30 and thermoplastic layer 40 are held in position, for example using clamps 50, during the thermoforming step. In one aspect, thermoforming is performed using heat and vacuum, but any thermoforming technique, such as other pressure forming methods, can be utilized for this step. Following the thermoforming step, the thermoformed thermoplastic layer 40 and the stretchable substrate 30, including the stretchable conductive traces and any component contact pads printed thereon, take a three-dimensional shape that matches the mold used during the thermoforming.

At the step 160, a trimming step is performed where any excess material is removed to trim the final product IME device to a desired outline and shape. In some embodiments, the excess material includes the portion of the stretchable substrate 30 and thermoplastic layer 40 contacting the adhesive 36 such that the final product IME device does not include any adhesive 36.

At the step 170, a molding step is performed to encapsulate the thermoformed stretchable substrate 30 and corresponding conductive interconnects 32 and electrical components 34 with an overmold 42. In some embodiments, only the top side of the thermoformed structure is encapsulated, as shown at the step 170. In other embodiments, the backside of the thermoformed structure is also encapsulated. The overmold may serve to enhance the rigidity of the thermoformed structure and/or add cosmetic features. It is understood that the step 170 is an optional step, and that the final product IME device can be with or without encapsulation by molding. Methods of molding can include, but are not limited to, low pressure molding (LPM), injection molding, compression molding, transfer molding, or similar encapsulation methods.

Figure 3:
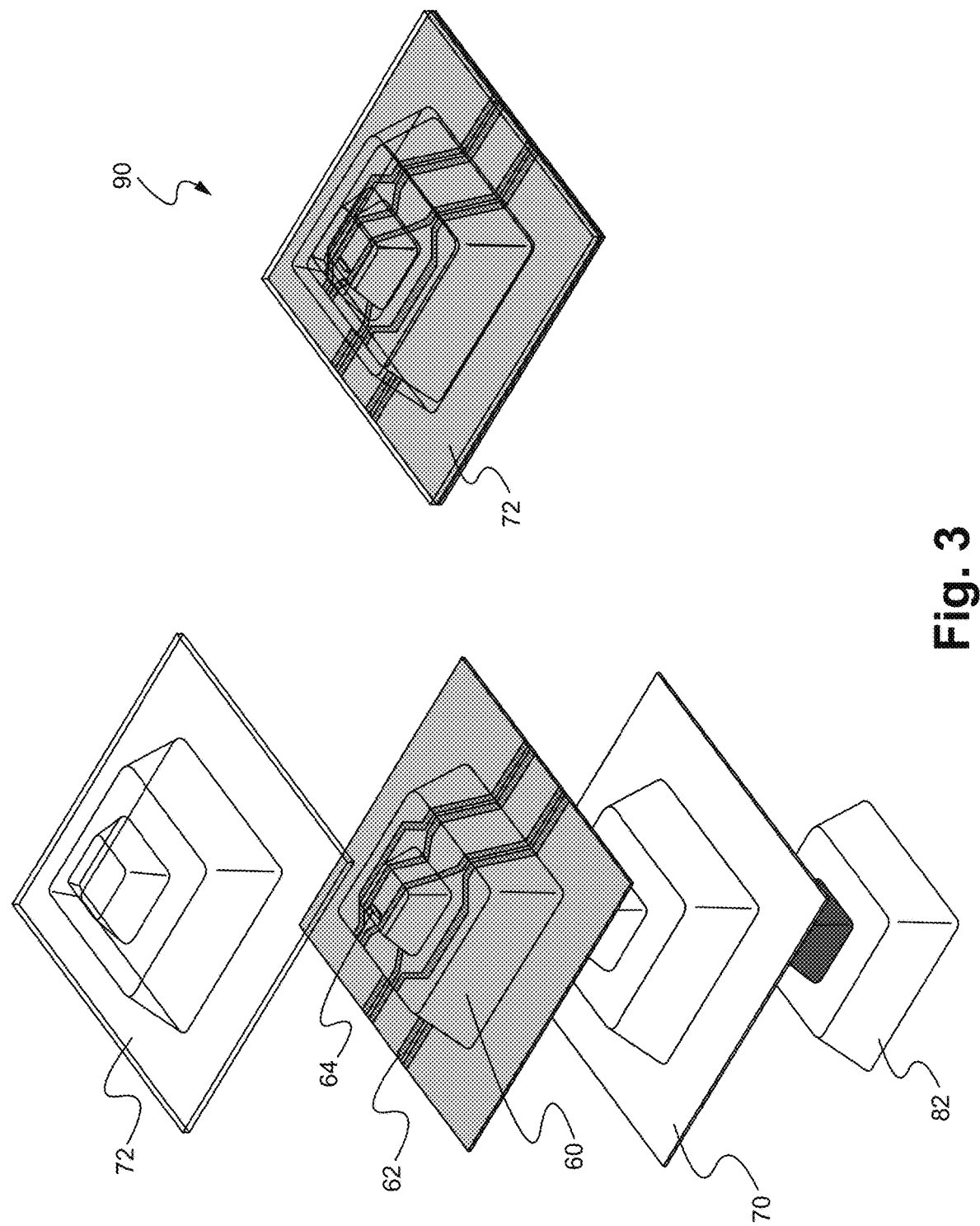
FIG. 3 illustrates an exploded view of an exemplary final product IME device and a non-exploded view of the exemplary final product IME device utilizing the method of the instant disclosure.

FIG. 3 illustrates an exploded view of an exemplary final product IME device and a non-exploded view of the exemplary final product IME device utilizing the method of the instant disclosure. The exploded view of the IME device 90, shown on the left hand side of FIG. 3, shows a formed stretchable substrate 60 and a formed thermoplastic layer 70, formed using the thermoforming mold 82, and an overmold 72. The thermoforming mold 82 is shown for exemplary purposes and is not part of the final product IME device 90. Conductive interconnects 62 are printed on a first surface of the stretchable substrate 60, and an electrical component 64 is selectively attached to two of the conductive interconnects 62. As shown in the non-exploded view, right hand side of FIG. 3, the final product IME device 90 includes the plastic overmold 72 for encapsulating the first surface (top side) of the stretchable substrate 60 including the conductive interconnects 62 and the electrical component 64.

In general, the electrical components can be printed or can be discrete non-printed components. The discrete electrical components can be attached by electrically conductive adhesive (ECA), low temperature soldering, or other similar low temperature attach methods. Adhesive between stretchable substrate and thermoplastic layer may or may not be added. The thermoplastic's bonding surface can be treated mechanically or chemically to enhance adhesion to the stretchable substrate. The final state of the stretchable substrate can be flat or in 3D form, depending on the desired final shape and application. Additionally, the final product IME device can have localized rigid and flexible areas, as desired by the design and application. For example, select sections of the thermoplastic layer 40 in FIG. 2 can be removed, leaving only the stretchable substrate in these areas. Such areas would be considered flexible areas.

At least the following advantages are afforded by the instant disclosure: 1) Use of stretchable substrates and stretchable inks to create deep drawn cavities and 3D shapes. The final product IME device can have deeper drawn thermoformed plastic features compared to currently available processes: although the final product IME device can also create shallow cavities and features with this process; 2) Pick and place component packages on stretchable substrates prior to or after thermoforming; 3) Printing of stretchable conductor ink and printing of other electrical components like stretchable resistors, capacitor, and switches on stretchable substrates; 4) Allows the construction of localized stretchable areas on rigid molded assembly; and 5) Use of a stretchable substrate to conform to very challenging 3D shapes. The use of a stretchable substrate can enable the use of a thinner thickness thermoplastic layer, and a thinner thermoplastic layer can more readily conform to more complex shapes. Additionally, the stretchable substrate can assist in protecting the printed component/elements during deep drawing of the cavities.

The present application has been described in terms of specific embodiments incorporating details to facilitate the understanding of the principles of construction and operation of the IME device and method of manufacturing the IME device. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A device comprising:
   a. a thermoplastic layer;
   b. a stretchable substrate laminated to the thermoplastic layer, wherein the stretchable substrate is made of a different material than the thermoplastic layer, further wherein the stretchable substrate includes a first surface and a second surface opposite the first surface, further wherein the second surface of the stretchable substrate is laminated directly to and in contact with the thermoplastic layer, further wherein the stretchable substrate is non-conductive; and
   c. an electrically stretchable conductor ink pattern on the first surface of the stretchable substrate to form a conductive interconnect, wherein the thermoplastic layer, the stretchable substrate and the conductive interconnect are thermoformed to a molded shape.

2. The device of claim 1 wherein the molded shape is a three-dimensional shape.

3. The device of claim 1 wherein the thermoplastic layer is made of a non-stretchable material.

4. The device of claim 1 wherein the thermoplastic layer is made of a material consisting of polycarbonate or formable polyethylene terephthalate.

5. The device of claim 1 wherein the stretchable substrate is made of a material consisting of thermoplastic polyurethane or thermoplastic elastomer.

6. The device of claim 1 wherein the electrically stretchable conductor ink is made of a material consisting of silver ink, copper ink, nickel ink, or a conductive ink embedded with polymer.

7. The device of claim 1 wherein the electrically stretchable conductor ink is further patterned to form an electrical component connected to the conductive interconnect.

8. The device of claim 1 further comprising a discrete electrical component coupled to the conductive interconnect.

9. The device of claim 8 further comprising an overmold formed over the thermoformed molded shape, wherein the overmold encapsulates the conductive interconnect and the discrete electrical component.

10. The device of claim 8 wherein the patterned electrically stretchable conductor ink forms at least two conductive interconnects, and the discrete electrical component is coupled to each of the at least two conductive interconnects.

11. The device of claim 1 further comprising a graphics layer printed onto a surface of the thermoplastic layer.

12. The device of claim 1 further comprising a first graphics layer printed onto a first surface of the thermoplastic layer and a second graphics layer printed onto a second surface of the thermoplastic layer.

13. A method of making an in-mold electronic device, the method comprising:
   a. providing a stretchable substrate, wherein the stretchable substrate is non-conductive, wherein the stretchable substrate includes a first surface and a second surface opposite the first surface;
   b. printing electrically stretchable conductor ink onto the first surface of the stretchable substrate to form a conductive interconnect;
   c. stacking the stretchable substrate onto a thermoplastic layer to form a stack-up, wherein the second surface of the stretchable substrate is stacked directly to and in contact with the thermoplastic layer;
   d. thermoforming the stack-up to form a molded subassembly; and
   e. trimming the molded subassembly to form a molded shape.

14. The method of claim 13 wherein the electrically stretchable conductor ink is further printed to form an electrical component connected to the conductive interconnect.

15. The method of claim 13 further comprising attaching a discrete electrical component onto the conductive interconnect prior to thermoforming the stack-up.

16. The method of claim 15 further comprising molding an overmold over the thermoformed molded shape, wherein the overmold encapsulates the conductive interconnect and the discrete electrical component.

17. The method of claim 13 further comprising attaching a discrete electrical component onto the conductive interconnect after thermoforming the stack-up.

18. The method of claim 17 further comprising molding an overmold over the thermoformed molded shape, wherein the overmold encapsulates the conductive interconnect and the discrete electrical component.

19. The method of claim 13 further comprising curing the printed electrically stretchable conductor ink prior to forming the stack-up.

20. The method of claim 13 wherein stacking the stretchable substrate onto the thermoplastic layer comprises first applying an adhesive between the stretchable substrate and the thermoplastic layer, wherein the adhesive maintains proper alignment of the stretchable substrate to the thermoplastic layer prior to thermoforming the stack-up.

21. The method of claim 13 wherein the molded shape is a three-dimensional shape.

22. The method of claim 13 wherein the thermoplastic layer is made of a non-stretchable material.

23. The method of claim 13 further comprising printing a graphics layer onto a first surface of the thermoplastic layer prior to forming the stack-up.

24. The method of claim 13 further comprising printing a first graphics layer onto a first surface of the thermoplastic layer prior to forming the stack-up and printing a second graphics layer onto a second surface of the thermoplastic layer prior to forming the stack-up.

* * * * *